United States Patent [19]
Mangelsdorf

[11] Patent Number: 5,886,579
[45] Date of Patent: Mar. 23, 1999

[54] VARIABLE GAIN CMOS AMPLIFIER

[75] Inventor: Christopher W. Mangelsdorf, Reading, Mass.

[73] Assignee: Analog Devices, Inc., Norwood, Mass.

[21] Appl. No.: 85,074

[22] Filed: May 26, 1998

Related U.S. Application Data

[62] Division of Ser. No. 657,483, May 28, 1996, Pat. No. 5,757,230.

[51] Int. Cl.[6] .................................................... H03F 3/45
[52] U.S. Cl. ........................................ 330/253; 330/254
[58] Field of Search ................................. 330/252, 253, 330/254, 261, 279, 285

[56] References Cited

U.S. PATENT DOCUMENTS

| | | | |
|---|---|---|---|
| 3,919,654 | 11/1975 | Toumani | 330/133 X |
| 4,520,324 | 5/1985 | Jett et al. | 330/253 X |
| 4,934,770 | 6/1990 | Anderson et al. | 330/278 |
| 5,668,502 | 9/1997 | Rijns | 330/254 |
| 5,757,230 | 5/1998 | Mangelsdorf | 330/254 X |

FOREIGN PATENT DOCUMENTS 2 284 117  5/1995  United Kingdom .

OTHER PUBLICATIONS

Ono, K., etl., "Design of Low–Distortion MOS OTA Based on Cross–Coupled Differential Amplifier and its Application for Active Filters", IEICE Transactions on Fundamentals of Electronics, Communications and Computer Sciences, vol. E77–A, No. 2, 1 Feb. 1994, pp. 363–370.

Patent Abstracts of Japan, vol. 017, No. 476 (E–1424), 30 Aug. 1993 and JP 05 114836 A (Toshiba Corp.), 7 May 1993.

Ramesh Harjani, *A Low Power CMOS VGA for 50 Mb/s Disk Drive Read Channels* Jun. 1995, pp. 370–376, IEEE Transactions on Circuits and Systems, Analog and Digital Signal Processing, vol. 42, No. 6.

Zhenhua Wang, *A CMOS Four–Quadrant Analog Multiplier With Single–Ended Voltage Output And Improved Temperature Performance*, Sep. 1991, pp. 1293–1301, IEEE Journal Of Solid–State Circuits, vol. 26, No. 9.

Zhenhua Wang & Walter Guggenbuhl. *A Voltage–Controllable Linear MOS Transconductor Using Bias Offset Technique*, Feb. 1990, pp. 315–317, IEEE Journal of Solid–State Circuits, No.1.

*Primary Examiner*—Steven J. Mottola
*Attorney, Agent, or Firm*—Wolf, Greenfield & Sacks, P.C.

[57] ABSTRACT

A variable gain amplifier includes an input transconductor having a transconductance that is variable in response to a first control signal, an output circuit having a transresistance that is variable in response to a second control signal and a gain controller responsive to a gain control signal x for providing the first and second control signals to the input transconductor and the output circuit. The amplifier has a voltage gain equal to the product of the transconductance and the transresistance. When the first control signal is a function (1+x) of the gain control signal and the second control signal is a function (1−x) of the gain control signal, the voltage gain of the amplifier is approximately an exponential function of the gain control signal.

3 Claims, 7 Drawing Sheets

VARIABLE GAIN CMOS AMPLIFIER

This application is a divisional of application Ser. No. 08/657,483, filed May 28, 1996, now U.S. Pat. No. 5,757,230, entitled VARIABLE GAIN CMOS AMPLIFIER.

FIELD OF THE INVENTION

This invention relates to variable gain amplifiers and, more particularly, to a variable gain CMOS amplifier wherein the gain may be an exponential function of the gain control signal.

BACKGROUND OF THE INVENTION

Certain applications require a variable gain CMOS amplifier which has an exponential (linear in dB) gain control characteristic over a prescribed range. The amplifier should be able to handle reasonably large signals with reasonably low distortion and have very low input noise. An example of an application is a variable gain amplifier for preconditioning CCD signals in a camcorder, where the variable gain amplifier is used to maintain an acceptable signal level input to an analog-to-digital converter.

In one prior art approach, a standard differential pair with a variable tail current is used to drive a pair of diode-connected devices, also with variable bias current. If the bias is arranged so that the current in one pair increases as the current in the other pair decreases, the resulting voltage gain has the form: gain=sqrt $((1+x)/(1-x))$. This technique is described by R. Harjani in, "A Low-Power CMOS VGA for 50 Mb/s Disk Drive Read Channels", *IEEE Transactions on Circuits and Systems-II: Analog and Digital Processing*, Vol. 42, No. 6, June 1995, pp. 370–376. Over a limited range, this expression is a good approximation to an exponential. However, this design has drawbacks. Because current control of transconductance is used, the gain is limited by the square root nature of the device to a fairly small range. Also, the signal path linearity is not great unless large gate-to-source voltages are used.

As to linearity over a large signal range, a linear large signal MOS transconductor is described by Z. Wang et al in "A Voltage-Controllable Linear MOS Transconductor Using Bias Offset Technique", *IEEE Journal of Solid State Circuits*, Vol. 25, No. 1, February 1990, pp. 315–317. An analog multiplier which utilizes a linear MOS transconductor is described by Z. Wang in "A CMOS Four-Quadrant Analog Multiplier with Single-Ended Voltage Output and Improved Temperature Performance", *IEEE Journal of Solid-State Circuits*, Vol. 26, No. 9, September 1991, pp. 1293–1301. The known prior art circuits do not satisfactionally meet the variable gain amplifier requirements outlined above.

SUMMARY OF THE INVENTION

According to the present invention, an amplifier comprises an input transconductor and an output circuit. The input transconductor has an input terminal for receiving an input voltage to the amplifier and an output terminal. The input transconductor has a transconductance $g_{mi}$. The output circuit has an input terminal coupled to the output terminal of the input transconductor and an output terminal for supplying an output voltage of the amplifier. The output circuit has a transresistance $1/g_{mo}$. The amplifier has a voltage gain $g_{mi}/g_{mo}$ equal to the product of the transconductance and the transresistance. The transconductance $g_{mi}$ is a linear function of a first control signal, and $g_{mo}$ is a linear function of a second control signal. In a variable gain configuration, the input transconductor comprises a first variable gain transconductor, and the transconductance is variable in response to the first control signal supplied to the first variable gain transconductor. The output circuit comprises a second variable gain transconductor with feedback, and the transresistance is variable in response to the second control signal supplied to the second variable gain transconductor. The amplifier may further include a gain controller responsive to a gain control signal x for providing the first and second control signals. The gain controller may include means for generating the first and second control signals such that the voltage gain of the amplifier approximates an exponential function of the gain control signal. More specifically, the gain controller may comprise means for generating a first function (1+x) of the gain control signal and for generating a second function (1−x) of the gain control signal. The first control signal comprises the first function (1+x), and the second control signal comprises the second function (1−x). When these control signals are applied to the first and second variable gain transconductors, the gain is an exponential function of the gain control signal x.

In a preferred embodiment, the first and second variable gain transconductors each comprise an MOS amplifier stage having a transconductance that is a linear function of a variable control voltage. The first and second variable gain transconductors may each comprise first, second, third and fourth transistors, each having a gate, a drain and a source, a first voltage source coupled between the gates of the first and third transistors and a second voltage source coupled between the gates of the second and fourth transistors. Differential inputs are coupled to the gates of the first and second transistors. A first differential output is supplied by the drains of the first and fourth transistors, and a second differential output is supplied by the drains of the second and third transistors. The first and second voltages are variable in response to one of the control signals to vary the transconductance of the amplifier stage.

In a first embodiment, the output circuit comprises a variable gain transconductor connected between the input and output terminals of the output circuit and a feedback circuit including a connection between the input and output terminals of the output circuit. The variable gain transconductor and the feedback circuit implement a transresistor having variable transresistance. The variable gain transconductor is responsive to the second control signal.

In a second embodiment, the output circuit comprises a fixed gain amplifier connected between the input and output terminals of the output circuit and a feedback circuit including a variable gain transconductor connected between the output and input terminals of the output circuit. The variable gain transconductor is responsive to the second control signal.

In a third embodiment, the output circuit comprises a fixed gain transconductor and a first variable gain transconductor connected in series between the input and output terminals of the output circuit. The first variable gain transconductor has a connection between its input and output and acts as a load for the fixed gain transconductor. The output circuit further comprises a feedback circuit including a second variable gain transconductor connected between the output and input terminals of the output circuit. The first and second variable gain transconductors are responsive to the second control signal.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
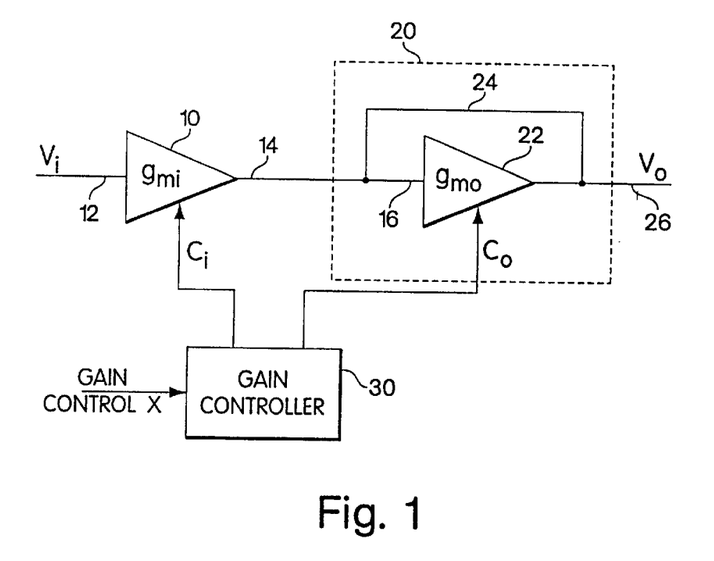
FIG. 1 is a block diagram of a first embodiment of a variable gain amplifier in accordance with the present invention.

A block diagram of a variable gain amplifier in accordance with the invention is shown in FIG. 1. An amplifier input voltage $V_i$ is supplied to an input terminal 12 of a variable gain input transconductor 10 having a transconductance $g_{mi}$. An output terminal 14 of transconductor 10 is connected to an input terminal 16 of an output circuit 20. An output terminal of circuit 20 is connected to an amplifier output 26. In the example of FIG. 1, output circuit 20 includes a variable gain transconductor 22 having an input connected to the output terminal 14 of transconductor 10 and an output terminal that supplies an output voltage $V_o$ on output 26. The output circuit 20 further includes a feedback circuit 24 that couples the output voltage $V_o$ of transconductor 22 back to the input terminal 16 of circuit 20. In the example of FIG. 1, the feedback circuit 24 is a direct connection between the input and output terminals of variable gain transconductor 22. The variable gain transconductor 22 has a transconductance $g_{mo}$. The output circuit 20 has a transfer function $1 g_{mo}$ and functions as a load for the input transconductor 10. More particularly, the transconductor 22 with feedback functions as a resistor having a resistance $1/g_{mo}$ that is variable. A gain controller 30 receives a gain control signal x and supplies a first control signal $C_i$ to variable gain transconductor 10 and a second control signal $C_o$ to variable gain transconductor 22. The transconductance of each of the transconductors 10 and 22 may be variable in response to the respective control signals $C_i$ and $C_o$. However, in a particular application, the transconductors 10 and 22 may have fixed transconductances.

The voltage gain of the amplifier shown in FIG. 1 is given by:

$$A_o = V_o/V_i = g_{mi}/g_{mo} \quad (1)$$

The transconductance of each of the variable transconductors 10 and 22 is a linear function of the respective control signals $C_i$ and $C_o$. The transconductances of the variable transconductors 10 and 22 can be expressed as:

$$g_{mi} = K_i(1+x) \quad (2)$$

$$g_{mo} = K_o(1-x) \quad (3)$$

where $K_i$ and $K_o$ are constants, and x is the gain control signal. The gain is then given by:

$$A_o = \frac{K_i(1+x)}{K_o(1-x)} \approx \frac{K_i}{K_o} e^{2x} \quad (4)$$

The gain $A_o$ approximates an exponential function of the control signal x. Thus, by generating appropriate control signals $C_i$ and $C_o$, the voltage gain of the amplifier is an exponential function of the gain control signal x so long as x is between −1 and +1.

Figure 2:
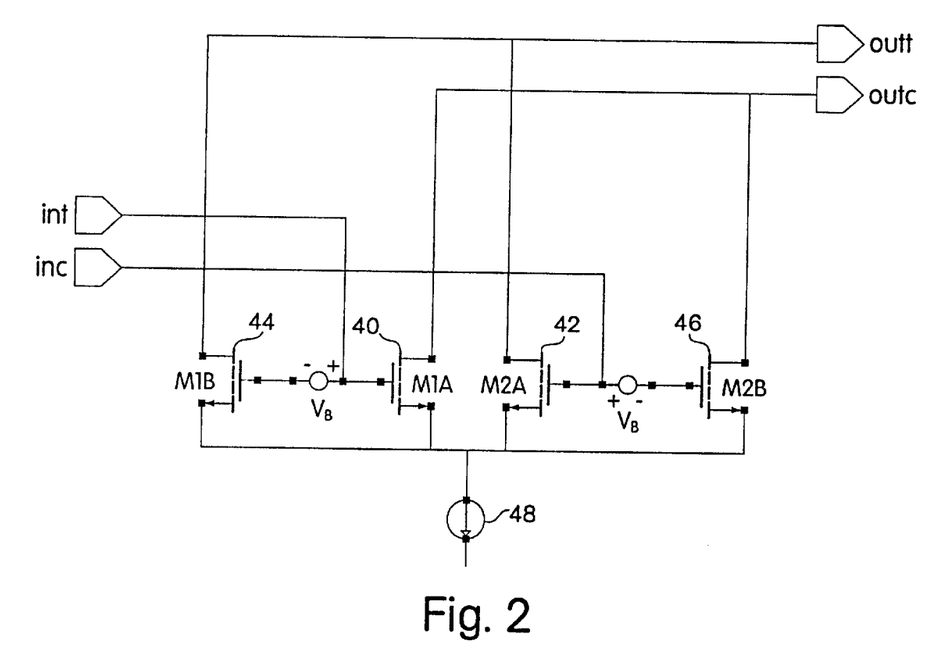
FIG. 2 is a simplified schematic diagram of a linearized transconductor which may be used in the amplifier of the present invention.

A simplified schematic diagram of a linearized transconductor is shown in FIG. 2. Differential inputs int and inc are connected to the gates of transistors 40 and 42, respectively. The gates of transistors 44 and 46 are offset in voltage from the gates of transistors 40 and 42, respectively, by a voltage $V_B$. The drains of transistors 42 and 44 are connected together and provide an output output. The drains of transistors 40 and 46 are connected together and provide an output outc. The sources of transistors 40, 42, 44, and 46 are connected to a current source 48. When the voltage $V_B$ is relatively large, transistors 40 and 42 carry all the current, and the transconductance is that of a simple differential pair. As voltage $V_B$ is decreased, transistors 44 and 46 carry more current and decrease the net transconductance of the circuit. At $V_B=0$, the transconductance goes to zero if all the transistors are the same size. The transconductance is given by $g_m = KV_B$ until the transistors 44 and 46 begin to turn off. The transconductor circuit shown in FIG. 2 has the additional benefit that it is linearized to operate over a larger signal range than a simple differential pair and has a linear relation between transconductance and the voltage $V_B$.

Figure 3:
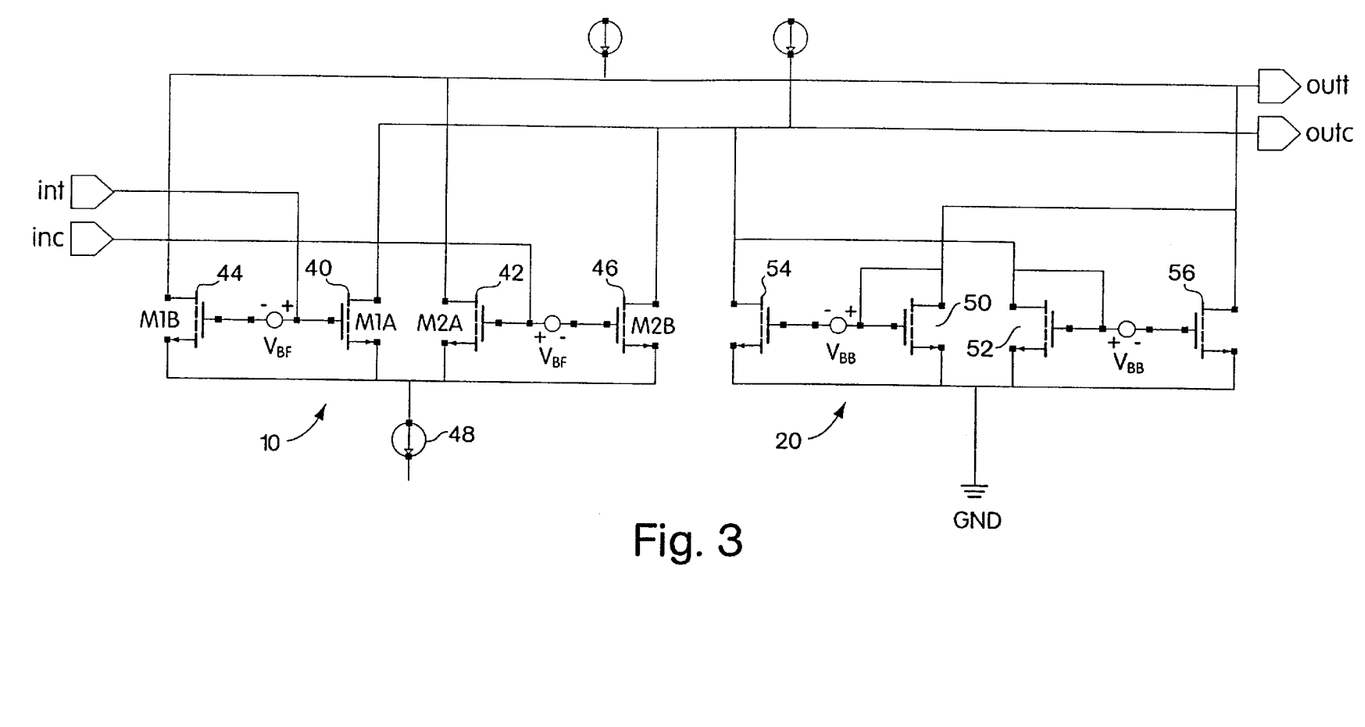
FIG. 3 is a simplified schematic diagram of the input transconductor and the output circuit shown in FIG. 1.

The differential current output of the transconductor shown in FIG. 2 can be supplied to a similar diode-connected stage acting as a load. A simplified schematic diagram of this configuration is shown in FIG. 3. Like elements in FIGS. 2 and 3 have the same reference numerals. Transistors 40, 42, 44 and 46 correspond to input transconductor 10 shown in FIG. 1. Transistors 50, 52, 54 and 56 correspond to output circuit 20 shown in FIG. 1. The transconductance $g_{mi}$ of input transconductor 10 is a linear function of control voltage $V_{BF}$, and the transconductance $g_{mo}$ of output circuit 20 is a linear function of control voltage $V_{BB}$. Output outc is connected to the drains of transistors 52 and 54 and to the gate of transistor 52. Output outt is connected to the drains of transistors 50 and 56 and to the gate of transistor 50. The sources of transistors 50, 52, 54 and 56 are connected to a fixed voltage, such as ground. In the output circuit 20, a feedback circuit connects the drain and gate of transistor 50 and the drain and gate of transistor 52, corresponding to the feedback circuit 24 shown in FIG. 1.

By varying control voltages $V_{BF}$ and $V_{BB}$ in an appropriate manner, the exponential control function represented by equation (4) can be obtained. When the control voltage $V_{BB}$ is fixed, a simple linear control characteristic is obtained. When the control voltage $V_{BF}$ is fixed, a 1/x control characteristic is obtained. The gain of the circuit shown in FIG. 3 is given by $K_F V_{BF}/K_B V_{BB}$, where $K_F$ and $K_B$ are constants.

Figure 4:
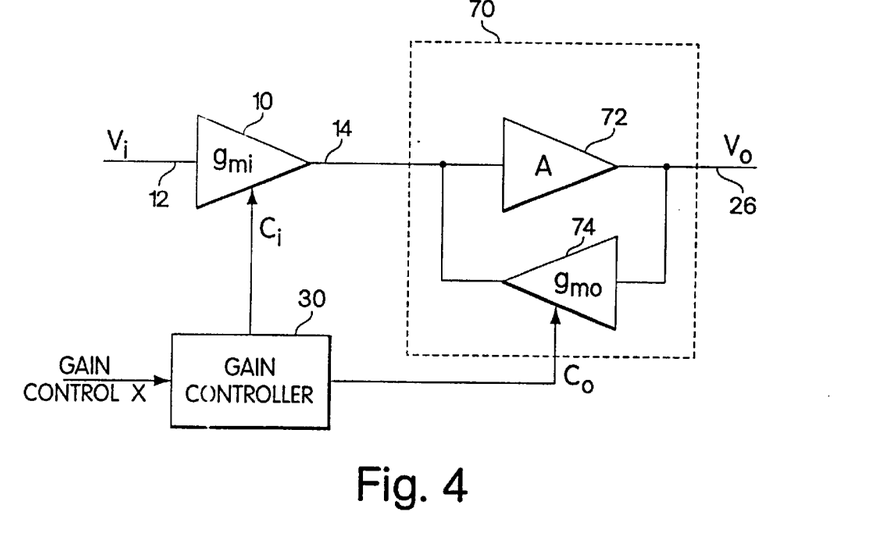
FIG. 4 is a block diagram of a second embodiment of a variable gain amplifier in accordance with the present invention.

A block diagram of a second embodiment of the variable gain amplifier of the present invention is shown in FIG. 4. Like elements in FIGS. 1 and 4 have the same reference numerals. An output circuit 70 is connected between output terminal 14 of input transconductor 10 and output 26 of the amplifier. The output circuit 70 includes a fixed gain amplifier 72 having an input connected to terminal 14 and an output connected to output 26. The output circuit 70 further includes a variable gain transconductor 74 in a feedback configuration. The input of transconductor 74 is connected to the output of amplifier 72, and the output of transconductor 74 is connected to the input of amplifier 72. The gain controller 30 provides control signal $C_o$ to variable gain transconductor 74.

The embodiments shown in FIGS. 1 and 4 provide generally satisfactory performance. However, in both embodiments, the bandwidth is a function of the transconductance $g_{mo}$ of the output circuit 20 or 70. Thus, when the transconductance of the output circuit is changed, the bandwidth of the amplifier is changed.

Figure 5:
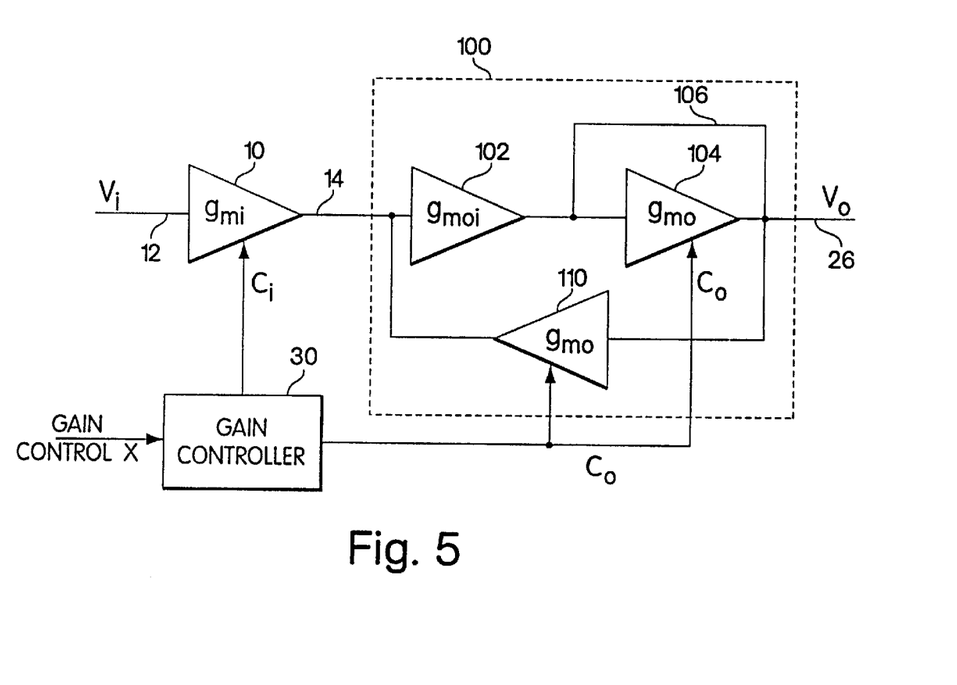
FIG. 5 is a block diagram of a third embodiment of a variable gain amplifier in accordance with the present invention.

A block diagram of a third embodiment of the amplifier, which overcomes the above drawbacks, is shown in FIG. 5. Like elements in FIGS. 1 and 5 have the same reference numerals. An output circuit 100 has an input terminal connected to output terminal 14 of transconductor 10 and an output terminal connected to output 26 of the amplifier. The output circuit 100 includes a fixed gain transconductor 102 and a variable gain transconductor 104 connected in series between terminal 14 and output 26. More particularly, fixed gain transconductor 102 has an input connected to terminal 14 and an output connected to the input of variable gain transconductor 104. The output of variable gain transconductor 104 is connected to output 26. A feedback connection 106 connects the input and the output of transconductor 104. A feedback circuit of the output circuit 100 comprises a variable gain transconductor 110 having an input connected to amplifier output 26 and an output connected to terminal 14. The variable gain transconductors 104 and 110 each receive control signal $C_o$ from gain controller 30.

Figure 6:
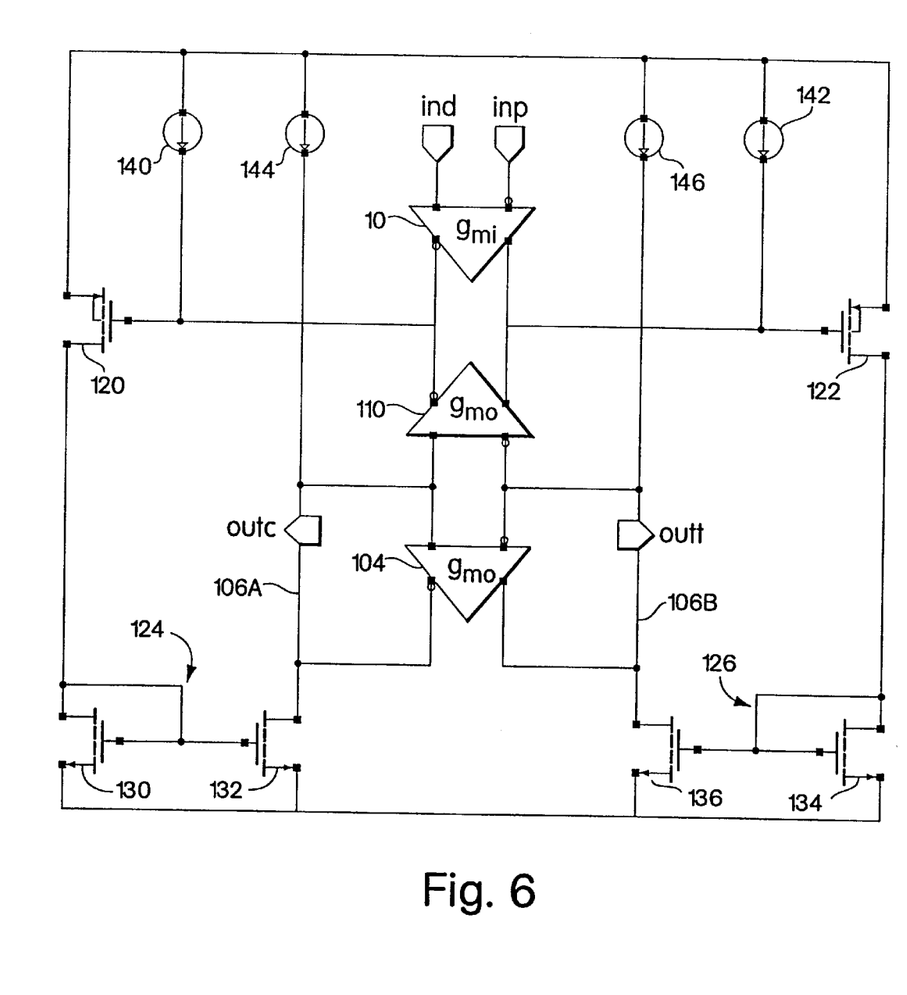
FIG. 6 is a simplified schematic diagram of an implementation of the variable gain amplifier shown in FIG. 5.

A simplified schematic diagram of the variable gain amplifier of FIG. 5, with the gain controller 30 omitted, is shown in FIG. 6. Like elements in FIGS. 5 and 6 have the same reference numerals. Variable gain transconductors 10, 110 and 104 are shown as having differential inputs and outputs in FIG. 6. Feedback connection 106 of FIG. 5 is shown as differential feedback connections 106A and 106B in FIG. 6. The fixed gain transconductor 102 is implemented as transistors 120 and 122, and current mirrors 124 and 126. Current mirror 124 includes a transistor 130 having its drain connected to the drain of transistor 120 and a transistor 132 having its drain connected to one input/output of variable gain transconductor 104. Similarly, current mirror 126 includes a transistor 134 having its drain connected to the drain of transistor 122 and a transistor 136 having its drain connected to the other input/output of variable gain transconductor 104. The gates of transistors 130 and 132 are connected together and are connected to the drain of transistor 130. The gates of the transistors 134 and 136 are connected together and are connected to the drain of transistor 134. Current sources 140 and 142 are connected to the differential outputs of transconductor 10, respectively. Current sources 144 and 146 are connected to the differential inputs/outputs of transconductor 104, respectively.

In the configuration of FIGS. 5 and 6, the impedance at the output of input transconductance 10 is decreased compared to the embodiment of FIG. 1. The current of transconductance 110 is servoed to match the differential current from the input transconductor. The transconductor 104 is connected as a simple diode. The purpose of transconductor 104 is to keep the gain of the loop constant as the transconductances are varied. In contrast to the configuration of FIG. 1, the diode-connected transconductor 104 does not create the output voltage. Instead, it merely loads the feedback loop. The output voltage is created by the servo action of the feedback loop and is thus much more accurate.

Figure 7:
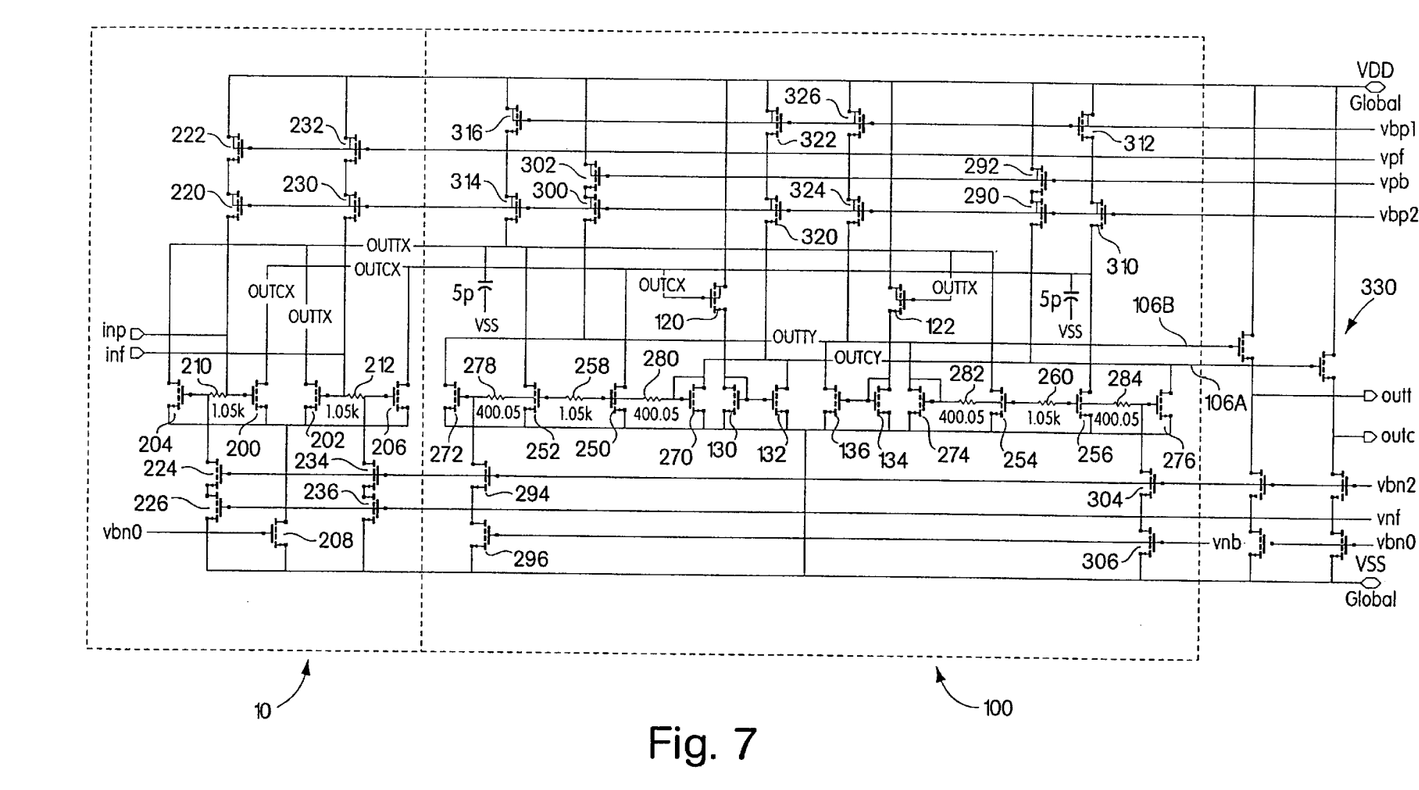
FIG. 7 is a schematic diagram of an example of a circuit for implementing the input transconductor and the output circuit shown in FIG. 5.
Figure 8:
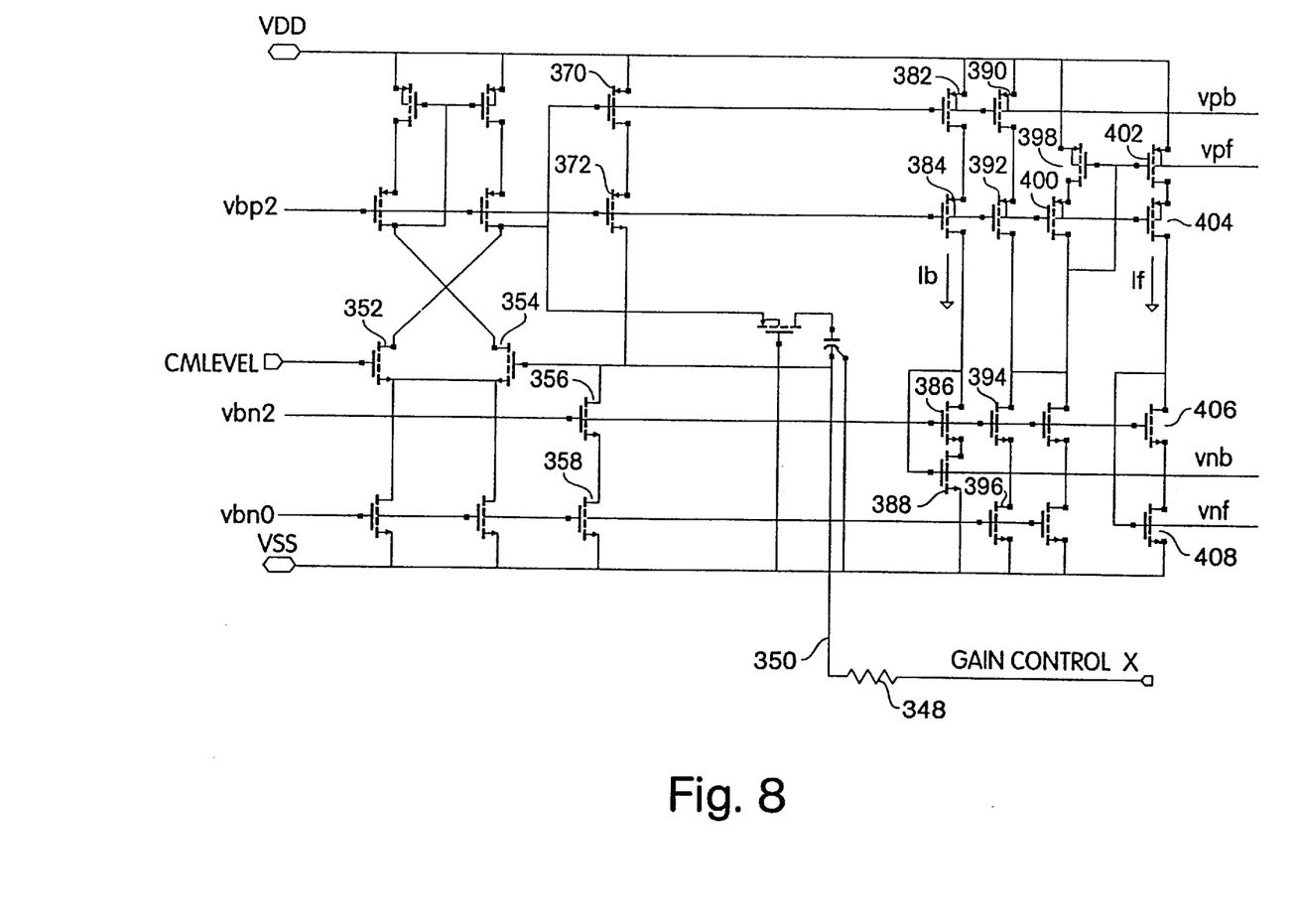
FIG. 8 is a schematic diagram of an example of a circuit for implementing the gain controller shown in FIG. 5.

A schematic diagram of an example of a circuit implementation of the variable gain amplifier of FIGS. 5 and 6 is shown in FIGS. 7 and 8. The input transconductor 10 and the output circuit 100 are shown in FIG. 7, and the gain controller 30 is shown in FIG. 8. Like elements in FIGS. 5–8 have the same reference numerals. The amplifier circuit of FIGS. 7 and 8 may be fabricated using a standard CMOS process. Transistors 200, 202, 204, 206, and 208, and resistors 210 and 212 implement the linearized variable gain input transconductor 10, as shown in FIG. 3 and described above. Transistors 200, 202, 204 and 206 correspond generally to transistors 40, 42, 44 and 46, respectively, and transistor 208 corresponds to current source 48. Resistor 210 is connected between the gates of transistors 200 and 204, and resistor 212 is connected between the gates of transistors 202 and 206. The control voltage for the input transconductor is developed across resistors 210 and 212. The gate of transistor 200 is coupled through transistors 220 and 222 to a supply voltage VDD, and the gate of transistor 204 is coupled through transistors 224 and 226 to a supply voltage VSS. Similarly, the gate of transistor 202 is coupled through transistors 230 and 232 to supply voltage VDD, and the gate of transistor 206 is coupled through transistors 234 and 236 to supply voltage VSS. A control voltage $V_{pf}$ applied to the gates of transistors 222 and 232 and a control voltage $V_{nf}$ applied to the gates of transistors 226 and 236 vary the currents through resistors 210 and 210. The variable voltages across resistors 210 and 212, which correspond to control voltage $V_{BF}$ shown in FIG. 3 and described above, cause a variation in the transconductance of the input transconductor 10. Thus, resistors 210 and 212 develop the variable control voltage $V_{BF}$ for the variable gain transconductor 10.

Transistors 250, 252, 254 and 256 implement the variable gain feedback transconductor 110 shown in FIGS. 5 and 6. The circuit configuration corresponds generally to the output circuit shown in FIG. 3 and described above. A resistor 258 is connected between the gates of transistors 250 and 252, and a resistor 260 is connected between the gates of transistors 254 and 256. Resistors 258 and 260 develop the variable control voltage $V_{BB}$ (FIG. 3) for variable gain transconductor 110. Transistors 270, 272, 274 and 276 implement the variable gain transconductor 104 shown in FIGS. 5 and 6. The circuit configuration likewise corresponds generally to the circuit configuration of the output circuit shown in FIG. 3 and described above.

A resistor 278 is connected between the gates of transistors 252 and 272; a resistor 280 is connected between the gates of transistors 250 and 270; a resistor 282 is connected between the gates of transistors 254 and 274; and a resistor 284 is connected between the gates of transistors 256 and 276. The gate and drain of transistor 270 are coupled through transistors 290 and 292 to supply voltage VDD. The gate of transistor 272 is coupled through transistors 294 and 296 to supply voltage VSS. Thus, the current through resistors 278, 258, and 280 is controlled by transistors 290, 292, 294 and 296. More specifically, the current through resistors 278, 258, and 280 is controlled by a control voltage $V_{pb}$ applied to the gate of transistor 292 and a control voltage $V_{nb}$ applied to the gate of transistor 296. Similarly, the gate and drain of transistor 274 are coupled through transistors 300 and 302 to supply voltage VDD, and the gate of transistor 276 is coupled through transistors 304 and 306 to supply voltage VSS. The current through resistors 282, 260 and 284 is controlled by the control voltage $V_{pb}$ applied to the gate of transistor 302 and the control voltage $V_{nb}$ applied to the gate of transistor 306. By controlling the currents through resistors 278, 258, 280, 282, 260 and 284, the transconductances of variable gain transconductors 104 and 110 (FIGS. 5 and 6) are controlled.

Resistors 278, 280, 282 and 284 in the variable gain transconductor 104 (FIGS. 5 and 6) make the diode-connected transconductor vary faster than the feedback transconductor 110. This produces more constant dynamics as the gain is changed.

The sources of transistors 272, 252, 250, 270, 130, 132, 136, 134, 274, 254, 256 and 276 are connected to the supply voltage VSS. Transistors 310 and 312 correspond to current source 140 shown in FIG. 6, and transistors 314 and 316 correspond to current source 142 shown in FIG. 6. Transistors 320 and 322 correspond to current source 144 shown in FIG. 6, and transistors 324 and 326 correspond to current source 146 shown in FIG. 6. The differential outputs of output circuit 100, including output outt on line 106B and output outc on line 106A, are supplied to a source follower circuit 330 for increased output drive.

A schematic diagram of an example of a gain controller circuit for implementing an exponential gain control characteristic is shown in FIG. 8. The circuit receives the gain control signal x and supplies control signals $V_{pb}$, $V_{pf}$, $V_{nb}$ and $V_{nf}$ to the corresponding control lines in the circuit of FIG. 7. The control signals $V_{pf}$ and $V_{nf}$ control the gain of the input transconductor 10 and are proportional to (1+x). The control signals $V_{pb}$ and $V_{nb}$ control the gain of output circuit 100 and are proportional to (1−x). This provides an overall exponential gain control characteristic of the form given by equation (4) and described above.

Referring to FIG. 8, the gain control signal x is supplied through a resistor 348 to a unity gain differential amplifier which includes transistors 352 and 354. The gain control signal x is applied to the gate of transistor 354, and a reference voltage is applied to the gate of transistor 352. The gain control signal x and the gate of transistor 354 are connected to a node 350. Transistors 356 and 358 form a fixed current source 368 which is connected to node 350. Series-connected transistors 370 and 372 supply current to node 350. The sum of the gain control current through resistor 348 and the current through transistors 370 and 372 equals the fixed current of current source 368. Thus, as the current supplied to node 350 by the gain control signal x increases, the current through transistors 370 and 372 decreases in order to maintain a fixed current through current source 368. In addition, the voltage at the gate of transistor 370 decreases as the gain control signal increases. The control signal $V_{pb}$ is connected to the gate of transistor 370. A current $I_b$ through transistors 382, 384, 386 and 388 is controlled by the control signal $V_{pb}$ at the gate of transistor 382 and is proportional to (1−x), where x is the gain control signal. The control signal $V_{nb}$ is obtained from the gate of transistor 388. Transistors 390 and 392 are connected in the same manner as transistors 382 and 384, respectively, and supply a current to a current source defined by transistors 394 and 396. Transistors 398 and 400 also supply a current to the current source defined by transistors 394 and 396. The current supplied by transistors 398 and 400 is mirrored into transistors 402 and 404. The control voltage $V_{pf}$ is obtained from the gates of transistors 398 and 402. A current $I_f$ through transistors 402 and 402 is supplied to transistors 406 and 408 and is proportional to (1+x). The control voltage $V_{nf}$ is taken from the gate of transistor 408. As indicated above, the control signals $V_{pf}$ and $V_{nf}$ control the gain of the input transconductor 10, and the control signals $V_{pb}$ and $V_{nb}$ control the gain of output circuit 100 to provide an exponential gain control characteristic. If resistor 348 is the same material as the $V_B$ resistors in the transconductors (such as resistors 210 and 212 in input transconductor 10 and resistors 278, 258, 280, 282, 260 and 284 in output circuit 100), the resulting gain control characteristic is independent of process variations and temperature.

Figure 9:
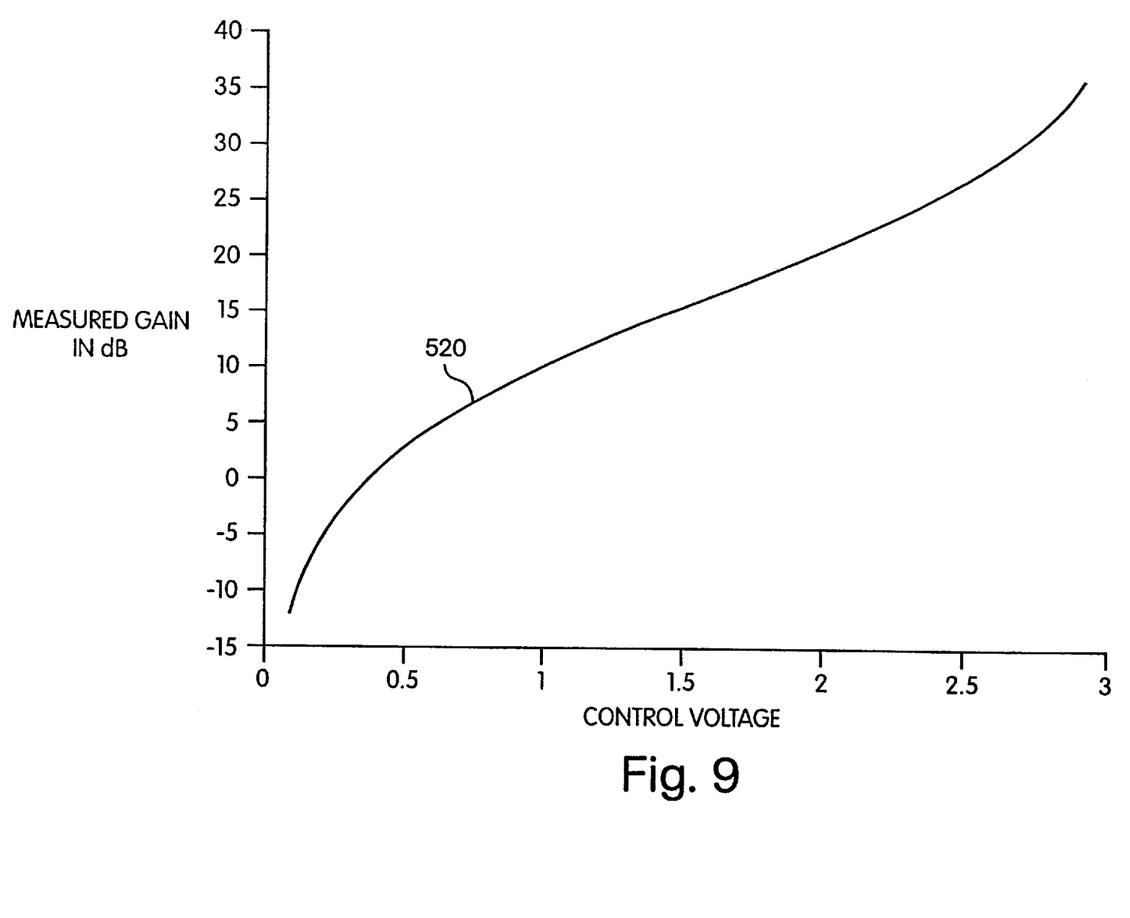
FIG. 9 is a graph of a gain in dB as a function of control voltage for the variable gain amplifier shown in FIGS. 7 and 8.

A graph of gain in dB as a function of control voltage for the amplifier circuit of FIGS. 7 and 8 is shown in FIG. 9. The control characteristic, indicated by curve 520, is relatively linear for the control voltage range of about 0.5 volts to 2.5 volts, indicating an exponential characteristic.

While there have been shown and described what are at present considered the preferred embodiments of the invention, it will be apparent to those skilled in the art that various changes and modifications can be made herein without departing from the scope of the invention as defined by the appended claims.

I claim:

1. A variable gain transconductor comprising:

first, second, third and fourth transistors, each having a gate, a drain and a source;

a first voltage source coupled between the gates of said first and third transistors; and a second voltage source coupled between the gates of said second and fourth transistors, wherein differential inputs are coupled to the gates of said first and second transistors, wherein a first differential output is supplied by the drains of said first and fourth transistors, wherein a second differential output is supplied by the drains of said second and third transistors, wherein said first and second voltage sources are variable in response to a control signal, wherein said first voltage source comprises a first resistor connected between the gates of said first and third transistors and first means responsive to said control signal for supplying a first variable current through said first resistor and wherein said second voltage source comprises a second resistor connected between the gates of said second and fourth transistors and second means responsive to said control signal for supplying a second variable current through said second resistor, whereby said transconductor has a transconductance that is variable in response to said control signal.

2. A variable gain transconductor as defined in claim 1 further comprising a gain control circuit for generating said control signal in response to a current through a gain control resistor, said gain control resistor and said first and second resistors being fabricated of the same material, whereby the transconductance of said transconductor as a function of the current through said gain control resistor is independent of process variations and temperature.

3. A variable gain transconductor as defined in claim 1 wherein said transconductance is a linear function of said control signal and wherein said differential outputs are a linear function of said differential inputs.

* * * * *